United States Patent [19]

Bryson, III et al.

[11] Patent Number: 4,764,673
[45] Date of Patent: Aug. 16, 1988

[54] ELECTRIC ELECTRON ENERGY ANALYZER

[75] Inventors: Charles E. Bryson, III, Palo Alto; Michael A. Kelly, Portola Valley, both of Calif.

[73] Assignee: Kevex Corporation, Foster City, Calif.

[21] Appl. No.: 44,227

[22] Filed: Apr. 30, 1987

[51] Int. Cl.$^4$ .............................................. H01J 47/00
[52] U.S. Cl. .................................... 250/305; 250/310; 250/396 R
[58] Field of Search .............. 250/294, 295, 296, 305, 250/306, 307, 310, 311, 396 R

[56] References Cited

U.S. PATENT DOCUMENTS

| | | | |
|---|---|---|---|
| 3,679,896 | 7/1972 | Wardly | 250/305 |
| 3,805,068 | 4/1974 | Lee | 250/305 |
| 4,179,604 | 12/1979 | Christou | 250/305 |
| 4,553,029 | 11/1985 | Matsuda | 250/296 |

FOREIGN PATENT DOCUMENTS 905567 7/1972 Canada ................................ 250/305

Primary Examiner—Carolyn E. Fields
Assistant Examiner—John A. Miller
Attorney, Agent, or Firm—Harry E. Aine

[57] ABSTRACT

In an electron spectrometer, electrons emanating from a source are collected and focused to a collimated stream by an electrostatic lens free of spherical aberration. The lens includes a pair of axially spaced concave grids approximating sections of concentric ellipsoids having a common focii and coaxial semi-major axes. The collimated electron stream is inducted into an electric radial cylindrical analyzer for focusing the electrons into radially dispersed lines on a position-sensitive detector with the radial dispersion being a function of their energies. The cylindrical analyzer section subtends an angle of approximately 63.5°. The grid openings in the grids of the electrostatic collimating lens are elongated in a direction transverse to the stream of the electrons passing therethrough and parallel to the radial electric field lines at the entrance to the electric analyzer to reduce the dispersive effect of the grids.

14 Claims, 1 Drawing Sheet

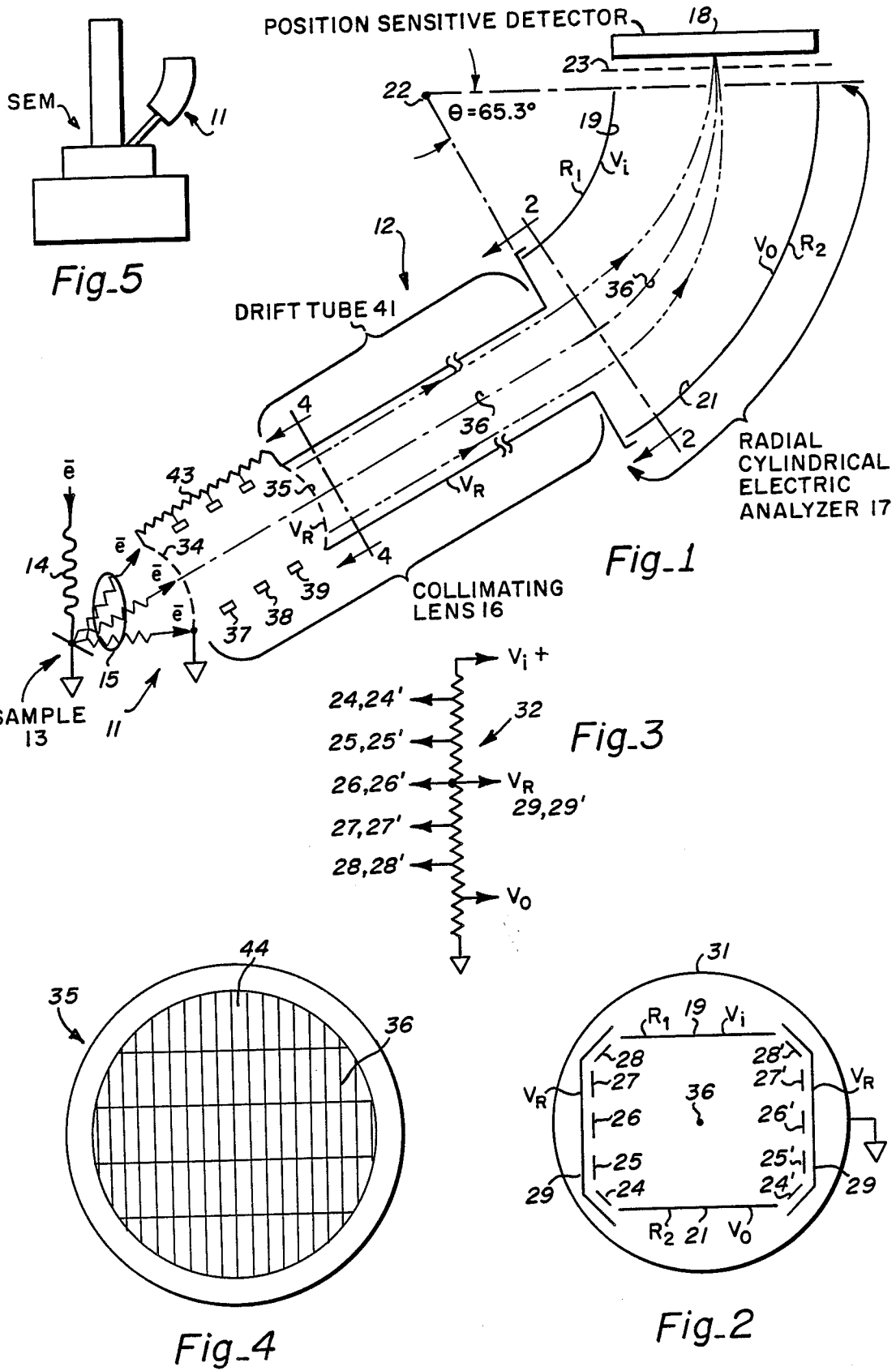

ELECTRIC ELECTRON ENERGY ANALYZER

BACKGROUND OF THE INVENTION

The present invention relates in general to electric electron energy analyzers and, more particularly, to an improved energy analyzer of the radial cylindrical type which is especially well suited for use in analyzing the energies of electrons emanating from a point source, such as the sample of a scanning electron microscope (SEM), electron spectroscopy for chemical analysis (ESCA), or a sample bombarded by the beam of a synchrotron.

DESCRIPTION OF THE PRIOR ART

Heretofore, electrostatic cylindrical mirror analyzers have been employed for analyzing the energy of electrons emanating from a sample of a SEM as bombarded by a primary beam of electrons to provide the additional feature of chemical analysis (ESCA) of the surface of the sample being observed. Such cylindrical mirror analyzers are difficult and thus costly to implement in SEMs because of the relatively large angle through which the electron beam is bent for the analysis, i.e., nearly 90°. The cylindrical mirror analyzer is described in a text entitled: "Building Scientific Apparatus", published by Addison-Wesley Publishing Co. in 1983 at page 310.

It is desired to obtain an improved system for analyzing energies of electrons emanating from a source, such as the sample of a SEM, which bends the electron trajectories through an angle less than 90° and which is relatively inexpensive to manufacture.

SUMMARY OF THE PRESENT INVENTION

The principal object of the present invention is the provision of an improved electric electron energy analyzer system.

In one feature of the present invention, a collimated stream of electrons to be analyzed is inducted into the electric field of a radial cylindrical analyzer and interacted with the electric field thereof over an arcuate sector subtending an angle sufficient to focus the electrons of the same energy to a line at the output, whereby the angle subtended by the sector is reduced to simplify fabrication cost and to make the form of the analyzer more compatible for use with a SEM.

In another feature of the present invention, the angle subtended by the arcuate sector of the radial cylindrical analyzer is approximately 63.5°.

In another feature of the present invention, the electrons to be analyzed are gathered from the source and collimated by an electron lens having a pair of concentric, generally ellipsoidally shaped electron permeable portions which have coaxial semi-major axes and a common focii, whereby spherical aberrations are controlled by the lens.

In another feature of the present invention, the electron permeable portions of the electric collimating lens are defined by elongated grid openings with the openings being elongated in a direction orthogonal to the velocity of the electrons passing therethrough and parallel to the direction of the radial electric field at the beam entrance to the radial cylindrical energy analyzer, whereby aberrations introduced by the grid openings are confined to the non-dispersive direction of the energy analyzer.

Other features and advantages of the present invention will become apparent upon a perusal of the following specification taken in connection with the accompanying drawings wherein:

BRIEF DESCRIPTION OF THE DRAWINGS

FIG. 1 is a schematic longitudinal sectional view, partly in block diagram form, of an electron spectrometer for chemical analysis (ESCA) and incorporating features of the present invention, FIG. 2 is a sectional view of the structure of FIG. 1 taken along line 2—2 in the direction of the arrows, FIG. 3 is a schematic line diagram of a potential divider for providing operating potentials for the electrodes of the structures of FIGS. 1 and 2, FIG. 4 is a sectional view of the structure of FIG. 1 taken along line 4—4 in the direction of the arrows and showing a plan view of the grid structure of the collimating lens, and FIG. 5 is a side elevational view of a SEM incorporating the electron spectrometer of the present invention.

DESCRIPTION OF THE PREFERRED EMBODIMENTS

Referring now to FIGS. 1 and 2, there is shown an electron spectrometer for chemical analysis 11 employing the electron energy analyzer 12 of the present invention. The surface of a sample 13, which is to be chemically analyzed, is disposed within an evacuated envelope, not shown, and bombarded with a stream 14 of ionizing radiation such as electrons, ultra-violet radiation, or x-rays to produce a stream of photoelectrons 15 emanating from the beam spot on the sample 13. The energies of the photoelectrons are a function of the various chemical constituents of the surface of the sample under analysis. By analyzing the energies of the photoelectrons, a chemical analysis of the surface constituents is obtained.

The stream of photoelectrons 15 emanating from the sample is gathered and collimated by a collimating electron lens 16 and thence fed into a radial cylindrical energy analyzer 17 for separating the electrons into lines according to their respective energies. A position-sensitive detector 18, at the output of the cylindrical energy analyzer 17, detects the separated lines of electrons to derive an output determinative of the chemical analysis of the surface constituents of the sample 13 under analysis.

The radial cylindrical energy analyzer 17 includes an inner cylindrical electrode 19 and an outer cylindrical electrode 21. The electrodes 19 and 21 are coaxial with an axis of revolution at 22. The inner electrode 19 has a radius of curvature $R_1$ and the outer electrode 21 has a radius of curvature $R_2$. Both electrodes 19 and 21 subtend an arcuate sector $\theta$ of approximately 63.5° such that collimated electrons of a given energy inducted into the analyzer 17 will be radially focused to a line on the position-sensitive detector 18 radially separated from lines associated with electrons of other energies. A termination screen 23 is disposed inbetween the detector 18 and the analyzer 17 and operated at a potential $V_R$ for separating fields of the detector 18 from fields of the analyzer 17.

Referring now to FIG. 2, there is shown the electrode configuration at opposite side edges of the cylindrical electrodes 19 and 21 for terminating the electric field so as not to distort the uniformity of the radial electric field in the interaction region of the analyzer 17. More particularly, there are five arcuate ribbon-shaped electrodes 24-28 and 24'-28', evenly spaced apart inbetween the inner and outer cylindrical electrodes 19 and 21 along opposite side edges of the electrodes 19 and 21. Arcuate channel-shaped electrodes 29 and 29' overlay the respective sets of electrodes 24-28 and 24'-28' to assist in properly terminating the radial electric fields along opposite side edges of the analyzer 17. A tubular vacuum envelope 31 encloses the electrodes and other elements of the spectrometer 11 and of the analyzer 17.

Referring now to FIG. 3, there is shown a potential divider 32 for deriving the operating potentials of the electrodes of FIG. 2. A source of potential, not shown, provides a positive potential $V_i$ for the inner electrode 19 and a more negative potential of $V_O$ for the outer electrode 21. The potential divider 32 is connected across the potentials $V_i$ and ground. A tap of the potential divider 32 provides the midplane reference potential $V_R$ for application to electrodes 29 and 29'. Potentials for electrodes 24-28 and 24'-28' are derived from the respective taps 24-28 and 24'-28' on the potential divider 32. The operating potential for any electrode 24-28 and 24'-28' is determined from the relationship $$V = V_R(1 + 2 \ln (R/R_R))$$

where $V_R$ is the midplane potential and potential of the drift tube 41, R is the radius of the electrode of interest, and $R_R$ is the midplane radius.

The collimating lens 16 includes an input concave grid 34 and an output concave grid 35 spaced apart along the optical axis 36 of the analyzer 12. The input grid 34 gathers photoelectrons emanating from the sample 13 and together with the output grid 35 and the intermediate ring electrodes 37, 38 and 39 and drift tube 41, operating at potential $V_R$, collimates the gathered electrons into a stream at the entrance to the cylindrical analyzer 17. The grids 34 and 35 are shaped and operated so as to focus the electrons into the collimated beam free of spherical aberrations.

This condition is achieved when the electron permeable portions of the grids 34 and 35 are respective sections of concentric ellipsoids having a common focii with their semi-major axes being coaxial with each other and with the optical axis 36 of the analyzer 12. The ellipsoidal grids are approximated by sections of non-concentric spherical sections closely approximating the ellipsoidal sections. The output grid 35 is operated at the potential $V_R$ of the drift tube 41 (electric field free region), whereas the input grid 34 is operated at ground potential. The intermediate ring electrodes are operated at intermediate potentials derived via the potential dividing resistor string 43.

Referring now to FIG. 4, there is shown, in plan view, the geometric configuration of the elongated grid openings 44. The grid openings 44 are elongated in a plane orthogonal to the optical axis 36 and the direction of elongation is generally parallel to the direction of the radial electric field vector at the entrance to the radial cylindrical analyzer 17. In this manner, aberrations in the focusing effect of the analyzer 12, introduced by the openings in the grids 34 and 35, are limited to the non-dispersive direction, i.e., in the direction of elongation of the focused lines, at the position-sensitive detector 18.

Referring now to FIG. 5, the electron spectrometer 11 is shown as attached to a conventional SEM.

In a typical physical realization of the electron spectrometer 11, the bombarding electrons 14 have an energy of 500-25,000 eV, the input grid 34 is spherical with a radius of curvature of 0.4699" spaced 0.550" from the sample 13. The output grid 35 is spherical with a radius of curvature of 0.8054" spaced 0.950" from the sample 13. The grid openings 44 are typically 0.0125" by 0.100". The drift tube 41 has a length of 14" and an inside diameter of 0.8" and is operated at $V_R$ of 1,000 volts. The inner electrode 19 is operated at 922.3 V, has a radius of curvature of 8.9" and an axial extent of 2.0". The outer electrode 21 has a radius of curvature of 11.1" and is operated at a potential of 1,069.6V $\theta$ and is 63.5°. The position-sensitive detector 18 is a model 3394SE, commercially available from Surface Science Instruments, a division of Kevex Corporation, the division being located in Mountain View, Calif.

With a subatmospheric pressure within the envelope 31 of the SEM and electron spectrometer 12 of less than $10^{-5}$ torr, the energy resolution obtained by the position-sensitive detector 18 is 0.5% of the mean energy being measured ranging from 50-2500 eV.

The advantage of the electric spectrometer 11 of the present invention is that it has a relatively large throughput of particles being analyzed, i.e., the beam collection angle is approximatey 40° while providing reasonably good resolution and having a relatively simple design which facilitates fabrication and reduces manufacturing costs.

What is claimed is:

1. In a method for analyzing the energy of electrons of differing energies emanating from an electron source, the steps of:

gathering and collimating electrons emanating from the source into a collimated stream of electrons of differing energies;

inducting the collimated stream of electrons into a radially directed electric field of an energy analyzer established between generally coaxial cylindrical equipotentials with the collimated beam of electrons entering the radial electric field with a velocity in a direction generally orthogonal to the direction of the radial electric field and generally tangential to the cylindrical equipotentials;

interacting the beam of inducted electrons with the radial electric field over an arcuate sector subtending a number of degrees such as to focus the inducted collimated stream of electrons of differing energies into radially separated lines of the same energy with said lines extending generally transverse to the radial electric field and generally parallel to one of the equipotentials at the electron beam exit of the sector of radial electric field; and detecting at least one of the radially separated focused lines of electrons to obtain an output indicative of the energy of the electrons emanating from the source.

2. The method of claim 1 wherein said arcuate sector subtends approximately 63.5°.

3. The method of claim 1 wherein the step of collimating the electrons into a collimated stream of electrons includes the step of:

inducting the electrons emanating from the source into an electric field established between a pair of generally ellipsoidally shaped equipotentials having a common focii, a common center, and coaxial semi-major axes to focus the inducted electrons into the collimated stream of electrons.

4. The method of claim 3 including the step of defining the generally ellipsoidally shaped equipotentials by a pair of spaced apart electrodes having concave shaped electron permeable portions through which the electrons pass serially.

5. The method of claim 4 including the steps of defining the electron permeable portions of said electrodes by the openings in a grid of intersecting members;

elongating said openings in said grid of intersecting members in a direction generally parallel to the direction of the radial electric field where the collimated stream of electrons is first inducted into the radial electric field of the energy analyzer so that aberrations introduced by the grid openings lie in the non-dispersive direction at the output end of the energy analyzer where the electrons are detected.

6. The method of claim 1 wherein electrons of differing energies inducted into the energy analyzer are focused by the energy analyzer to an array of spatially separated parallel lines in accordance with their respective energy; and detecting the spatially separated lines to derive an energy spectrum of the electrons emanating from the source.

7. In an electric electron energy analyzer for analyzing the energy of electrons emanating from an electron source;

collimating means for gathering and collecting electrons emanating from the electron source into a collimated stream of electrons;

energy analyzer means disposed to receive the collimated stream of electrons for resolving the energies of the electrons into spatially separated ribbon-shaped streams at the output of said energy analyzer;

detector means for detecting at least one of said spatially separated electron streams at the output of said energy analzyer means to obtain an output representative of the energy of the electrons emanating from the electron source; and said energy analyzer means including a pair of coaxial radially spaced, generally cylindrical electrode portions for establishing a generally radial electric field therebetween over an arcuate sector subtending a certain number of degrees such that the collimated electron stream inducted into the radial electric field and interacted with the radial electric field over said certain number of degrees serves to focus electrons of said collimated stream and of differing energies into the separated ribbon-shaped streams at the output of said energy analyzer means.

8. The energy analyzer of claim 7 wherein said certain number of degrees is approximately 63.5°.

9. The energy analyzer of claim 7 wherein the collimating means also directs the electrons into the radial electric field of the energy analyzer means in a direction generally orthogonal to the radial component of the radial electric field.

10. The energy analyzer of claim 7 wherein said collimating means includes a pair of electron permeable electrodes, each having a generally ellipsoidally shaped electron permeable portion through which the electrons pass serially; and said ellipsoidal portions having generally a common center, a generally common focii and generally coaxial semi-major axes generally coaxial with the optical axis of the collimated electron stream.

11. The energy analyzer of claim 10 wherein said ellipsoidal portions are approximated by sections of non-concentric spheres.

12. The energy analyzer of claim 10 wherein said electron permeable portions are defined by intersecting members to define grid openings and wherein said grid openings are elongated in a direction orthogonal to the collimated stream of the electrons and which direction of elongation is also generally parallel to the direction of the radial electric field where the collimated stream of electrons is inducted into the radial electric field of the electric analyzer, such that aberrations in the electron stream introduced by said grid openings are oriented into the non-dispersive direction of the electron energy analyzer at said detector means.

13. The method of claim 1 wherein the step of gathering and collimating the electrons emanating from the source into a collimated stream of electrons includes the step of:

inducting the electrons emanating from the source into an electric field established between a pair of concave grid electrodes having grid openings and said electrodes being spaced apart along the optical axis of the electron stream; and elongating the openings in said grid electrodes in a direction generally parallel to the direction of the radial electric field where the collimated stream of electrons is first inducted into the radial electric field of the energy analyzer so that aberrations introduced by the grid openings lie in the non-dispersive directions at the output end of the energy analyzer where the electrons are detected.

14. The energy analyzer of claim 7 wherein said collimating means includes a pair of electron permeable grid electrodes, each having a concave shaped electron permeable portion through which the electrons pass serially; and said electron permeable portions being defined by intersecting members to define a grid and wherein said grid openings are elongated in a direction orthogonal to the stream of the electrons and which direction of elongation is also generally parallel to the direction of the radial electric field where the collimated stream of electrons is inducted into the radial electric field of the electric analyzer, such that aberrations in the electron stream introduced by said grid openings are oriented into the non-dispersive direction of the electron energy analyzer at said detector means.

* * * * *